United States Patent
Chao

[11] Patent Number: 5,950,084
[45] Date of Patent: Sep. 7, 1999

[54] METHOD OF MANUFACTURING DUAL-PACKED CAPACITOR FOR DRAM CELLS

[75] Inventor: Fang-Ching Chao, Hsinchu, Taiwan

[73] Assignee: United Microelectronics Corp., Taiwan

[21] Appl. No.: 08/736,925

[22] Filed: Oct. 25, 1996

[30] Foreign Application Priority Data

Aug. 16, 1996 [TW] Taiwan ................................. 85109993

[51] Int. Cl.⁶ .............................................. H01L 21/8242
[52] U.S. Cl. ............................................ 438/244; 438/241
[58] Field of Search ................... 438/241, 243, 438/244, 253, 386, 387, 396

[56] References Cited

U.S. PATENT DOCUMENTS

| | | | |
|---|---|---|---|
| 4,833,094 | 5/1989 | Kenney | 438/243 |
| 5,026,659 | 6/1991 | Lee | 438/244 |
| 5,065,273 | 11/1991 | Rajeevakumar | 438/243 |
| 5,071,783 | 12/1991 | Taguchi et al. | 438/254 |
| 5,077,688 | 12/1991 | Kumanoya et al. | 365/149 |
| 5,089,869 | 2/1992 | Matsuo et al. | 257/303 |
| 5,102,820 | 4/1992 | Chiba | 438/398 |
| 5,126,810 | 6/1992 | Gotou | 257/306 |
| 5,142,639 | 8/1992 | Kohyama et al. | 257/306 |
| 5,155,657 | 10/1992 | Oehrlein et al. | 361/313 |
| 5,158,905 | 10/1992 | Ahn | 438/396 |
| 5,164,337 | 11/1992 | Ogawa et al. | 438/254 |
| 5,172,201 | 12/1992 | Suizu | 257/308 |
| 5,196,365 | 3/1993 | Gotou | 438/254 |
| 5,206,787 | 4/1993 | Fujioka | 257/307 |
| 5,266,512 | 11/1993 | Kirsch | 438/253 |
| 5,274,258 | 12/1993 | Ahn | 257/308 |
| 5,338,955 | 8/1994 | Tamura et al. | 257/306 |
| 5,354,701 | 10/1994 | Chao | 438/244 |
| 5,354,704 | 10/1994 | Yang et al. | 438/280 |
| 5,371,701 | 12/1994 | Lee et al. | 365/149 |
| 5,389,568 | 2/1995 | Yun | 438/396 |
| 5,399,518 | 3/1995 | Sim et al. | 438/396 |
| 5,438,011 | 8/1995 | Blalock et al. | 438/396 |
| 5,443,993 | 8/1995 | Park et al. | 438/396 |
| 5,453,633 | 9/1995 | Yun | 257/306 |
| 5,460,996 | 10/1995 | Ryou | 438/254 |
| 5,478,768 | 12/1995 | Iwasa | 438/253 |

(List continued on next page.)

FOREIGN PATENT DOCUMENTS

| | | |
|---|---|---|
| 0516031 A1 | 12/1992 | European Pat. Off. . |
| 4-26156 | 1/1992 | Japan . |
| 5-21745 | 1/1993 | Japan . |
| 5-251657 | 9/1993 | Japan . |
| 6-151748 | 5/1994 | Japan . |
| 2 252 447 | 8/1992 | United Kingdom . |

Primary Examiner—Chandra Chaudhari
Attorney, Agent, or Firm—Rabin & Champagne, P.C.

[57] ABSTRACT

Manufacturing dual-packed capacitor DRAM cells with the storage capacitors of two memory cells stacked one over the other and formed on a common trench so as to increase capacitance while decreasing area occupation by the capacitors includes forming a trench on a semiconductor substrate, forming an insulating layer above the semiconductor substrate surface covering the bottom and side walls of the trench, forming a first opening in the insulating layer exposing part of the semiconductor substrate adjacent to one side of the trench, forming a first storage electrode inside the trench above the surface of the insulating layer, which extends into the first opening and contacts the semiconductor substrate, forming a first dielectric layer above the surface of the first storage electrode, forming a common opposed electrode above the first dielectric layer which includes a vertical main section inserted into the trench, a horizontal main plate, and at least one extended section protruding vertically upward, forming a second dielectric layer covering an exposed surface of the common exposed electrode, forming a second opening in the insulating layer exposing part of the semiconductor substrate surface adjacent to another side of the trench, forming a second storage electrode above the second dielectric layer, and extending into the second opening contacting the semiconductor substrate, removing the exposed part of the insulating layer; forming a pair of pass transistors symmetrically on opposite sides of the trench, wherein the respective drain regions of the pass transistors are disposed nearest the trench and each is electronically coupled with a respective storage electrode.

16 Claims, 14 Drawing Sheets

U.S. PATENT DOCUMENTS

| | | | |
|---|---|---|---|
| 5,478,770 | 12/1995 | Kim | 438/253 |
| 5,482,886 | 1/1996 | Park et al. | 438/397 |
| 5,508,222 | 4/1996 | Sakao | 438/396 |
| 5,521,419 | 5/1996 | Wakamiya et al. | 257/394 |
| 5,523,542 | 6/1996 | Chen et al. | 438/396 |
| 5,543,346 | 8/1996 | Keum et al. | 438/397 |
| 5,550,080 | 8/1996 | Kim | 438/397 |
| 5,561,309 | 10/1996 | Cho et al. | 257/306 |
| 5,561,310 | 10/1996 | Woo et al. | 257/306 |
| 5,572,053 | 11/1996 | Ema | 257/308 |
| 5,595,931 | 1/1997 | Kim | 438/387 |

METHOD OF MANUFACTURING DUAL-PACKED CAPACITOR FOR DRAM CELLS

BACKGROUND OF THE INVENTION

1. Field of the Invention

The invention relates in general to the fabrication of semiconductor memory devices, and more particularly to the fabrication of DRAM cells which include two stacked storage capacitors implemented with a common trench for each pair of memory cells.

2. Description of the Related Art

In this electronic information age, DRAMs are so widely used in integrated circuits that doing without them is unthinkable. The structure of earlier DRAM cells consists of three transistors linked together. However, with rapid improvements in semiconductor technology, most memory cells now consist of just one pass transistor together with a storage capacitor, in order to meet the demand for high level integration through a reduction in component dimensions. In general, the source terminal of the pass transistor is connected to a bit line and the drain terminal is connected to the storage electrode of a storage capacitor, while the gate terminal is connected to a word line. The opposed electrode of the storage capacitor is connected to a fixed voltage source, and the gap between the storage electrode and the opposed electrode is filled by a dielectric layer. As persons familiar with the technology will understand, the storage capacitor is a device for storing charge representing data, and therefore should possess sufficiently high capacitance that the number of refreshes necessary to avoid data loss through charge leakage is minimized.

In the conventional process for manufacturing a 1 MB DRAM, for example, two dimensional capacitor components of a so-called planar-type capacitor are formed above the surface of a silicon substrate. However, the storage capacitor of the planar-type must occupy a considerable amount of surface area in the substrate in order to provide sufficient capacitance for operation, and as such, cannot meet the stringent processing demands for an ever increasing level of DRAM component integration. Thus, for highly integrated DRAMs, such as those having a memory capacity greater than 4 MB, it is necessary to utilize the third dimension in constructing the capacitor as well. There are many three-dimensional capacitor structures in use, and they can be classified roughly into two types, the so-called "stack type" and the so-called "trench type." Yet, no matter how much these known capacitor structures increase the capacitance, each capacitor component still must occupy a certain substrate area, and this sets a limit on the degree of miniaturization possible.

FIG. 1 is a circuit diagram of a pair of memory cells of a conventional trench type capacitor DRAM. The gate terminal 10 of a pass transistor $T_1$ is connected to a word line WL, the source region 14 is connected to a bit line $BL_1$, the drain region 16 is connected to the storage electrode 18 of a trench type capacitor $C_1$, and the storage electrode 18 is surrounded by the opposed electrode 20 of the storage capacitor $C_1$. Similarly, the gate terminal 10 of another pass transistor $T_2$ is connected to the word line WL, source region 14 is connected to another bit line $BL_2$, and drain region 16 is connected to the storage electrode 18 of another trench type capacitor $C_2$. An insulating layer 22 is also formed in between the two storage capacitors $C_1$ and $C_2$ to separate them. Each capacitor component of the aforementioned conventional trench type capacitor structure occupies a fixed amount of substrate area. The insulating layer also occupies a certain additional amount of substrate area, further limiting the amount of miniaturization possible.

Considering this problem, a double stacked trench capacitor DRAM structure and manufacturing method have been suggested by the present inventor, as disclosed in U.S. Pat. No. 5,354,704. Its main characteristic lies in using the same trench to house two storage capacitors, with one capacitor stacked on top of another, and each of the two capacitors leading to a respective memory cell, thereby enabling a reduction in the substrate area requirement for the storage capacitors. To clarify the structural connection and operation of this device, reference is made to FIG. 2 and FIG. 3. FIG. 2 is a circuit diagram of a pair of memory cells of the double stacked trench capacitor DRAM and FIG. 3 is a cross-sectional view of this DRAM component structure. Here, as in the device of FIG. 1, the gate terminals 10 of both pass transistors $T_1$ and $T_2$ are connected to a word line WL, and their source regions 14 are respectively connected separately to bit lines $BL_1$ and $BL_2$. Storage capacitors for the memory cells are formed stacked one on top of another inside a common trench 25. The gap between the storage electrode 18a and opposed electrode 20 is filled by a layer of dielectric (not shown in the figure) to form a storage capacitor which is electrically coupled to the drain region 16 of pass transistor $T_1$. Similarly, the gap between the storage electrode 18b and opposed electrode 20 is filled by a layer of dielectric (not shown in the figure) to form another storage capacitor that is electrically coupled to the drain region 16 of pass transistor $T_2$. Insulating layer 23 is used to separate the capacitors inside the trench from the substrate.

Due to the stacked structure of two capacitors inside a common trench in the double stacked trench capacitor DRAM, two memory cells can use the same piece of storage capacitor area and therefore substantially increase the level of component integration. Further, the insulating layer 22 separating the storage capacitors shown in FIG. 1 can be omitted freeing additional surface area on the substrate. However, as shown in FIGS. 2 and 3, to create two capacitors with equal capacitance, storage electrode 18b has to extend a certain distance above the substrate in order to have the same area as that of the storage electrode 18a. Because of this, the inventor realized improvements could still be made in the structure, as well as the manufacturing process of such a component, to reduce the substrate area used and thereby lead to a further increase in the level of component integration.

SUMMARY OF THE INVENTION

It is therefore an object of the invention to provide a method of manufacturing DRAM cells in which every two memory cells are connected to capacitors occupying the same storage capacitor area so as to increase the level of component integration.

Another object of the invention is to provide a method of manufacturing DRAM cells such that equal capacitance is ensured in each storage capacitor, while simultaneously the substrate area claimed by each capacitor pair is further reduced, as compared to prior structures.

To achieve the objects stated above, the invention provides a method of manufacturing dual-packed capacitor for DRAM cell including: (a) forming a trench having a bottom and side walls in a semiconductor substrate; (b) forming an insulating layer covering the surface of the semiconductor substrate and the bottom and side walls of the trench; (c) forming a first opening in the insulating layer exposing part of the semiconductor substrate adjacent to a first side of the trench; (d) forming a first storage electrode inside the trench on the surface of the insulating layer, and which extends into the first opening and contacts the semiconductor substrate; (e) forming a first dielectric layer covering the surface of the first storage electrode; (f) forming a common opposed electrode above the first dielectric layer, the common opposed electrode including a vertical main section extending into the trench, and a horizontal main plate extending parallel to the main surface of the substrate, and at least one extended section extending form the horizontal main plate perpendicular to the substrate surface, wherein, the first storage electrode, the first dielectric layer and a lower portion of the common opposed electrode together constitute a first capacitor; (g) forming a second dielectric layer above the common opposed electrode; (h) forming a second opening in the insulating layer exposing part of the semiconductor substrate surface adjacent to a second side of the trench; (i) forming a second storage electrode above the second dielectric layer, and which extends into the second opening and contacts the semiconductor substrate, wherein the second storage electrode, the second dielectric layer and an upper portion of the common opposed electrode together constitute a second capacitor; (j) removing an exposed part of the insulating layer; and (k) forming a pair of pass transistors symmetrically on opposite sides of the trench in the semiconductor substrate, each pass transistor including a gate, a source and a drain region, the respective drain regions of the pass transistors being disposed nearest the trench, and each being electrically coupled with a respective storage electrode.

An advantageous characteristic of the invention lies in the particulars of forming the common opposed electrode in step (f) above. In one embodiment, a thick conducting layer is deposited filling up the trench and covering the surface of the first dielectric layer and the insulating layer. Using a layer of photoresist as mask, at least one extended section is formed protruding vertically upward by etching away a portion of the top thick conducting layer and using another photoresist layer as mask, the remaining portion of the thick conducting layer is etching away until the surface of the first dielectric layer and the insulating layer are exposed to define a boundary pattern of the thick conducting layer, thereby forming the common opposed electrode.

The at least one extended section or sections protruding vertically upward as mentioned above can be a conducting layer with a pillar shaped structure, a conducting layer with a linear shaped structure or a conducting layer with a cross grid shaped structure, for example.

Another advantageous embodiment of the invention in the process of forming the common opposed electrode in step (f) above includes depositing a first conducting layer filling up the trench and covering the surface of the first dielectric layer and the insulating layer; using a layer of photoresist as mask, defining a pattern on the first conducting layer such that what remains inside the trench constitutes a vertical main section and what lies above the first dielectric layer constitutes a horizontal main plate; depositing a second insulating layer above the first conducting layer, the first dielectric layer and the insulating layer; forming at least one opening in the second insulating layer and exposing part of the first conducting layer surface; depositing a second conducting layer filling up the at least one opening or openings, forming at least one extended section protruding vertically upward; and removing the second insulating layer leaving behind the first conducting layer and the second conducting layer, which together form the common opposed electrode.

The at least one extended section or sections protruding vertically upward as mentioned above can be a conducting layer with a pillar shaped structure, a conducting layer with a linear shaped structure, or a conducting layer with a cross grid shaped structure.

Yet another embodiment of the invention in the process of forming the common opposed electrode in step (f) above includes depositing a first conducting layer filling up the trench and covering the surface of the first dielectric layer and the insulating layer; using a layer of photoresist as mask, defining a pattern on the conducting layer such that what remains inside the trench constitutes a vertical main section and what lies above the first dielectric layer constitutes a horizontal main plate; depositing a second insulating layer above the first conducting layer, the first dielectric layer and the insulating layer; forming an opening in the second insulating layer exposing part of the first conducting layer surface; depositing a second conducting layer and performing an etch back process to form a conducting side wall spacer layer in the opening with the second conducting layer forming the at least one extended section protruding vertically upward as a hollow pipe shaped structure; and removing the second insulating layer and leaving behind the first conducting layer and the conducting side wall spacer layer which together form the common opposed electrode.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DETAILED DESCRIPTION OF THE PREFERRED EMBODIMENTS

Figure 1:
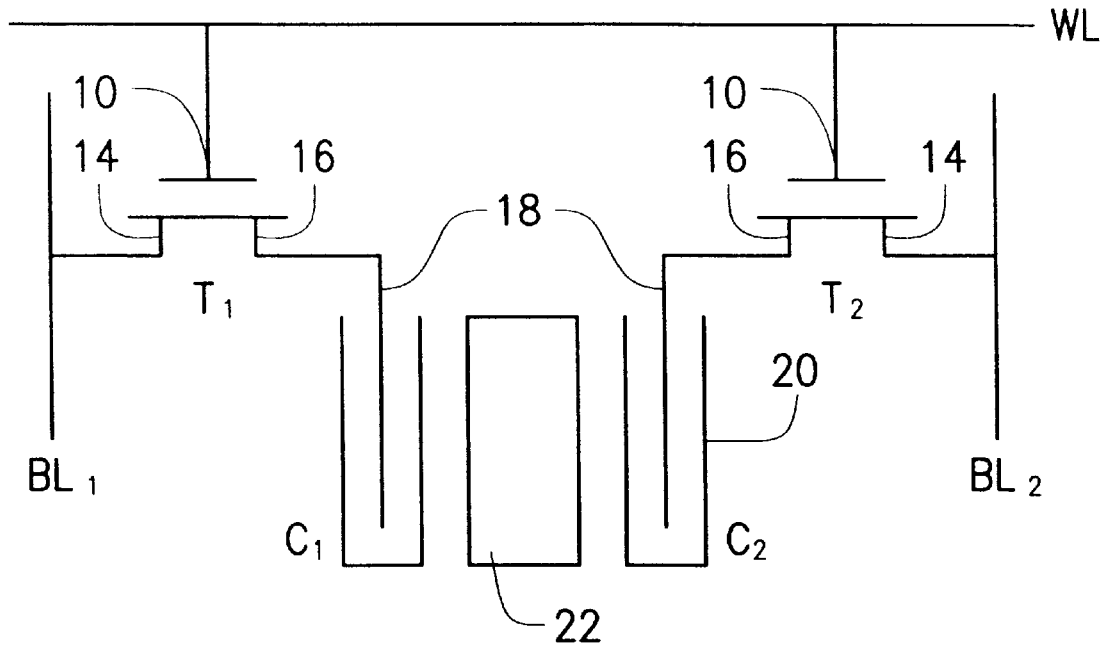
FIG. 1 is a circuit diagram of a pair of memory cells of a trench type capacitor DRAM.
Figure 2:
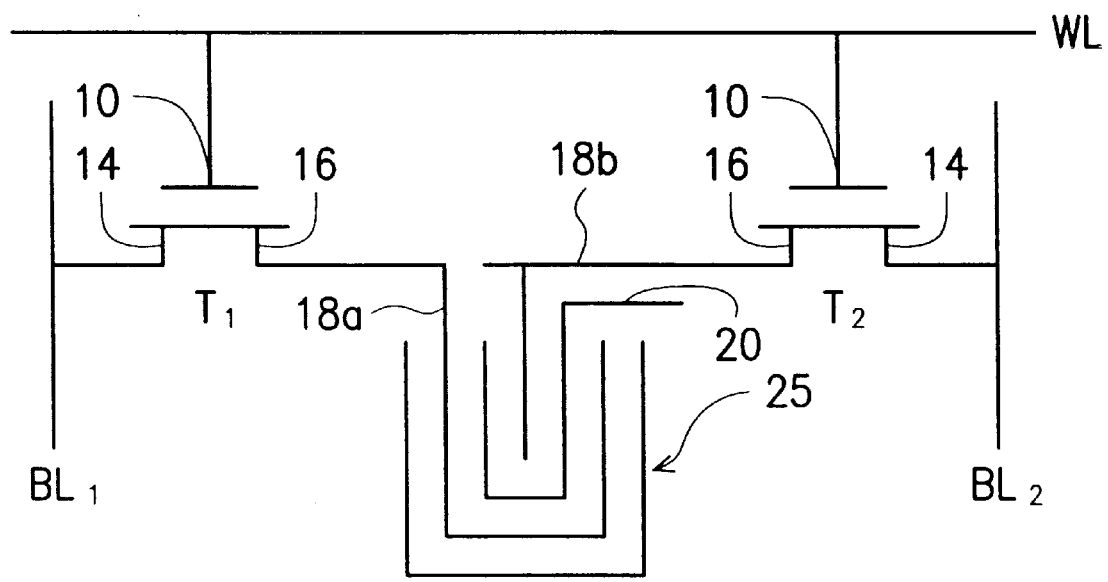
FIG. 2 is a circuit diagram of a pair of memory cells of a conventional double stacked trench capacitor DRAM.
Figure 3:
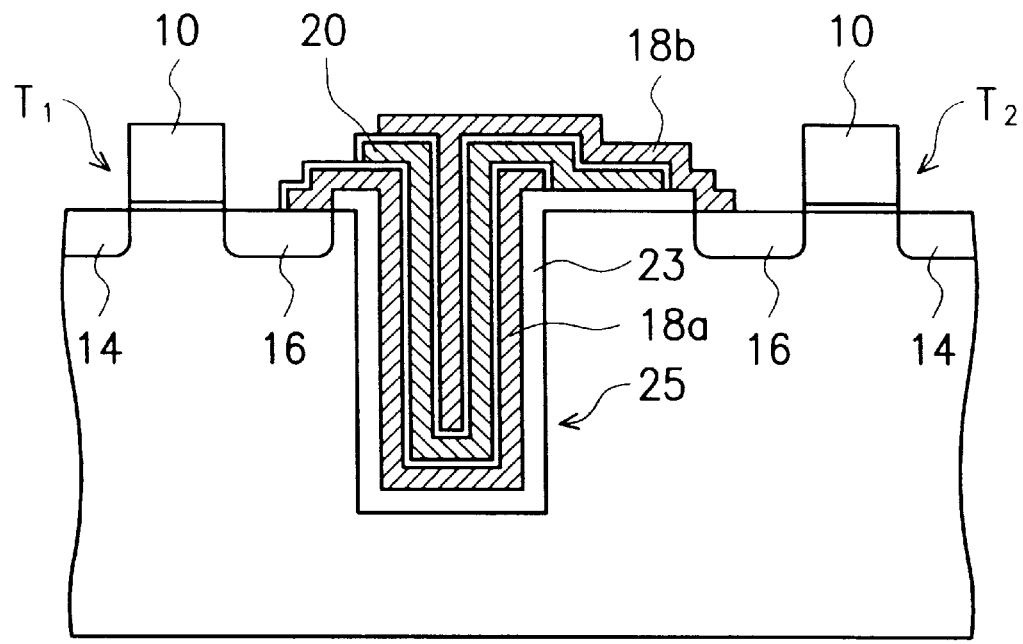
FIG. 3 is a cross sectional view of the DRAM component structure of FIG. 2.
Figure 4:
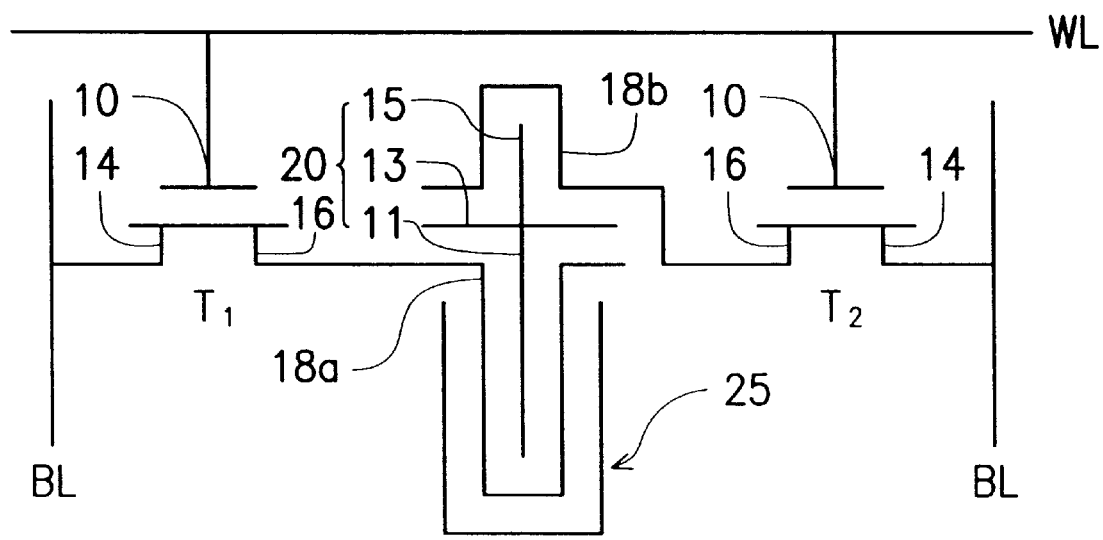
FIG. 4 is a circuit diagram of a dual packed capacitor DRAM structure with a pair of memory cells of the invention.

An exemplary embodiment of a dual packed capacitor DRAM cell of the invention is shown in the circuit diagram of FIG. 4. Similar to the device illustrated in FIG. 2, here, the gate terminals 10 of both pass transistors $T_1$ and $T_2$ are connected to a word line WL, and their source regions 14 are connected to bit lines $BL_1$ and $BL_2$ respectively. Storage capacitors for the memory cells are formed by a stacking structure using a common trench 25. A lower capacitor, which is electrically coupled to the drain region 16 of pass transistor $T_1$, is formed by storage electrode 18a and a lower portion of opposed common electrode 20 (main vertical section 11 and the lower surface of horizontal main plate 13) with a layer of dielectric (not shown) filling the gap between the two. An upper capacitor, which is electrically coupled to the drain region 16 of pass transistor $T_2$, is formed by storage electrode 18b and an upper portion of opposed common electrode 20 (the upper surface of horizontal main plate 13 and extended section 15 protruding vertically upward above and away from main plate 13) with a layer of dielectric (not shown) filling the gap between the two. Through manipulating the profile and size of extended section 15, substrate area occupancy for both storage capacitors can be roughly equalized and also reduce memory cell substrate area usage which is beneficial to miniaturization process applications, e.g., high level integration.

Several exemplary embodiments of the invention, showing a number of structural variations and manufacturing processing steps, are described with reference to the accompanying figures below.

FIRST EMBODIMENT

Figure 5A:
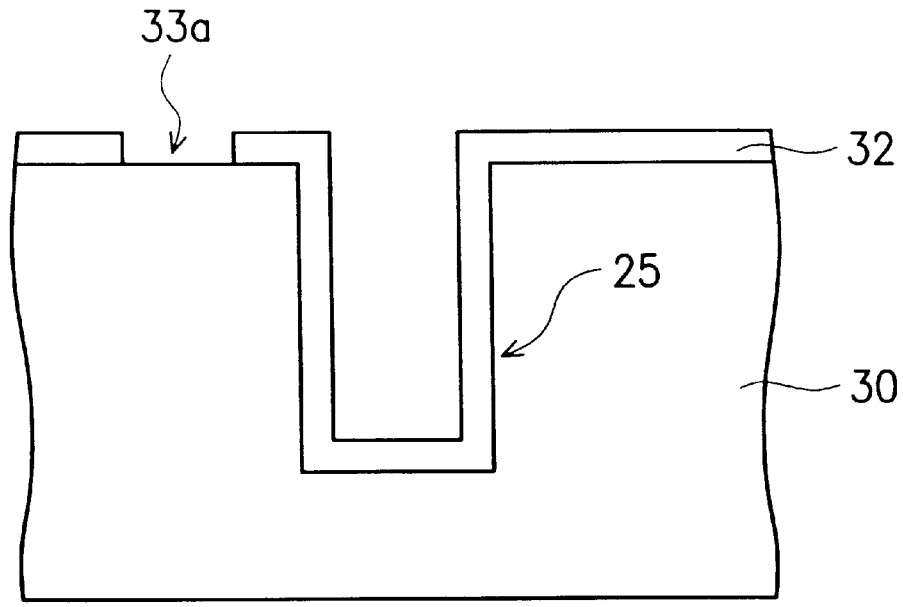
FIGS. 5A to 5H are cross-sectional views showing the manufacturing steps of an exemplary DRAM memory cell structure according to a first exemplary embodiment of the invention.

First, referring to FIG. 5A, a trench 25 is formed in a silicon substrate 30 by an etching method such as the reactive ion etch (RIE), for example. The mouth dimensions and the depth of the trench 25 depend on the component dimensions and the capacitance required, but typically mouth dimensions range from about $0.5 \times 0.5 \,\mu m^2$ to $1 \times 1 \,\mu m^2$ and the depth lies between 4 to 10 $\mu$m. An insulating layer 32 is then formed covering the surface of silicon substrate 30, as well as the bottom and side walls of the trench 25; for example, a layer of oxide with a thickness of about 500 to 2000 Å is deposited by the chemical vapor deposition (CVD) method. Next, photolithographic and etching techniques are employed to form a first opening 33a in the insulating layer 32, exposing part of the silicon substrate 30 surface adjacent to one side of the trench 25.

Figure 5B:
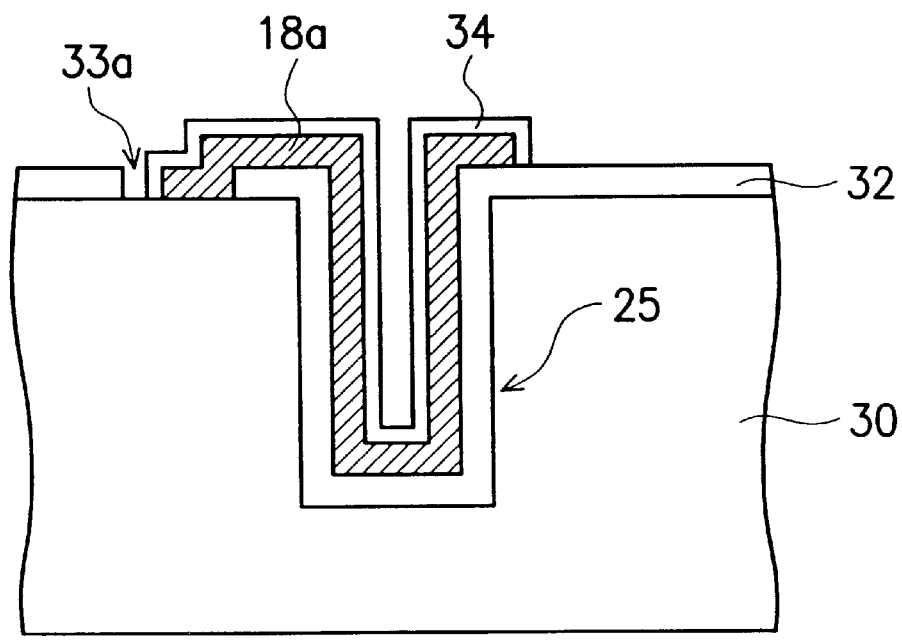

Referring next to FIG. 5B, a conducting layer, such as a polysilicon layer with a thickness between 500 to 2000 Å, is formed by the CVD method covering the insulating layer 32 and the silicon substrate 30 surface inside the first opening 33a. Then photolithographic and etching techniques are employed to define a pattern for forming a first storage electrode 18a with one end extending into the first opening 33a and making contact with silicon substrate 30. Thereafter, a first dielectric layer 34, such as a nitride/oxide (NO) double layered structure or an oxide/nitride/oxide (ONO) triple layered structure, is formed covering the exposed surface of the first storage electrode 18a.

Figure 5C:
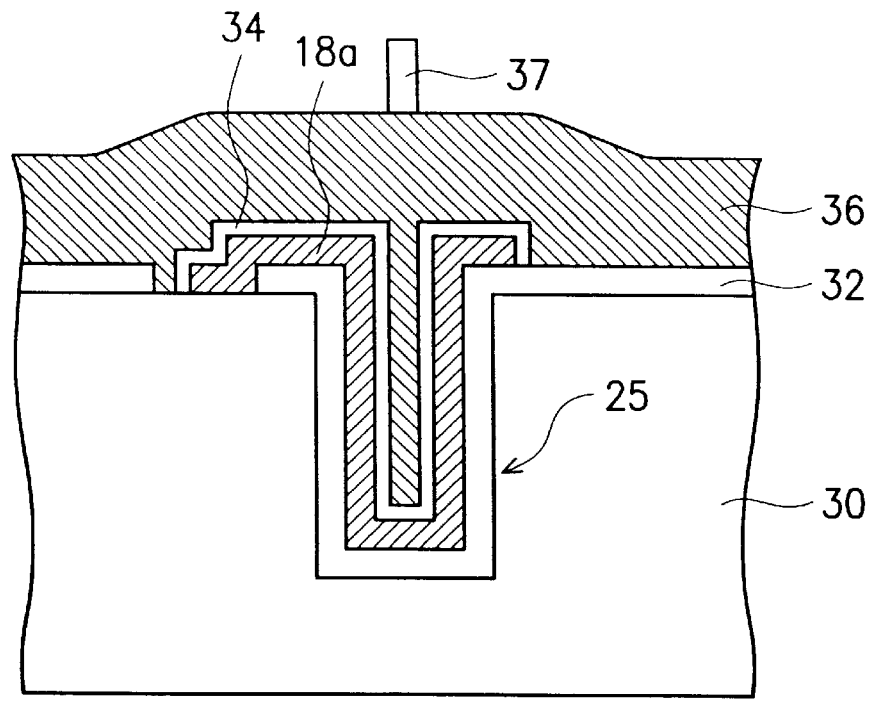
Figure 5D:
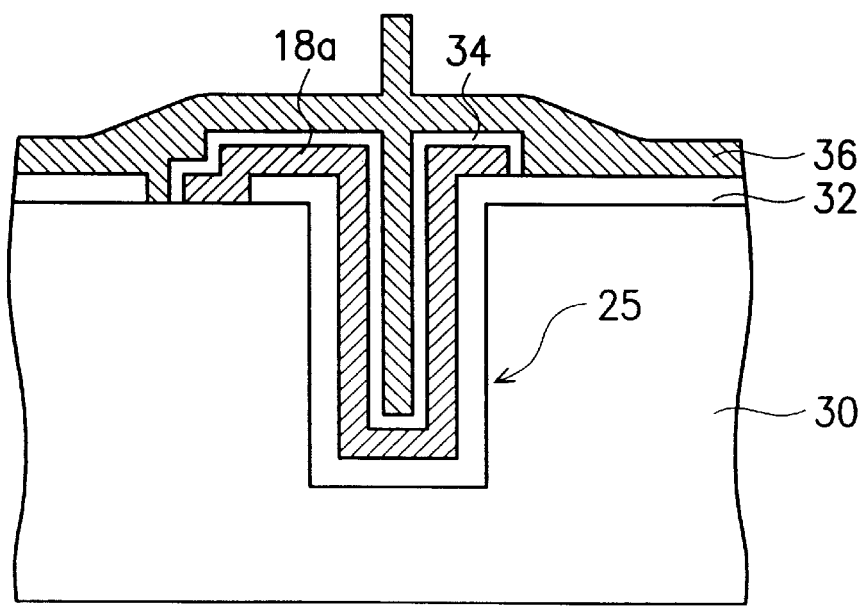

Referring next to FIG. 5C, a thick conducting layer 36, such as a polysilicon layer, is formed by the CVD method filling up the trench 25 and covering the surface of the first dielectric layer 34 and the insulating layer 32. Next, a layer of photoresist 37 is coated onto the surface of the thick conducting layer 36, and using a photolithographic technique a pattern is defined. With the photoresist layer 37 as a mask, a top layer of the thick conducting layer 36 is etched away forming a protruded section which may be either a pillar shaped or a linear shaped structure, for example, as shown in FIG. 5D.

Figure 5E:
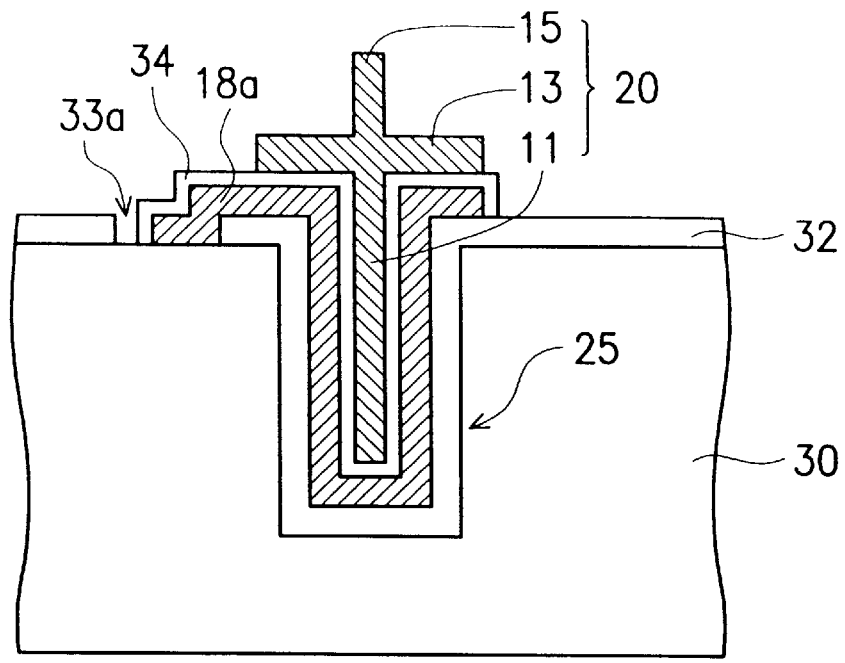

Using another photoresist layer (not shown) as a mask to cover a portion of the thick conducting layer 36 where the opposed electrode is to be located, the remaining thick conducting layer 36 is etched away until the surface of the first dielectric layer 34 and the insulating layer 32 are exposed, resulting in the cross-shaped structure shown in FIG. 5E defined in the thick conducting layer 36. The cross-shaped structure will act as common opposed electrode 20 of the storage capacitors. The electrode 20 has a vertical main section 11 which extends into the trench 25, a horizontal main plate 13, and an extended section 15 protruding vertically upward from the surface of main plate 13. The first storage electrode 18a, the first dielectric layer 34 and a lower portion of the common opposed electrode 20 together form the structure of a first capacitor, i.e., a trench-type storage capacitor.

Figure 5F:
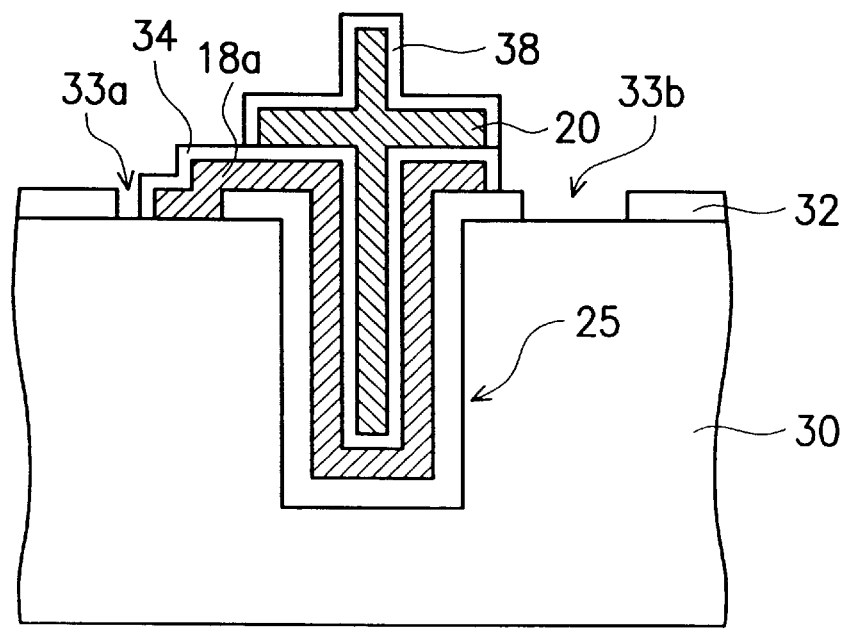

Referring next to FIG. 5F, a second dielectric layer 38, such as a nitride/oxide (NO) double layered structure or an oxide/nitride/oxide (ONO) triple layered structure, is formed covering the exposed upper surface of the common opposed electrode 20. Next, using photolithographic and etching techniques, a second opening 33b is formed in the insulating layer 32 exposing a portion of silicon substrate 30 surface adjacent to the trench 25 on the side opposite from the first opening 33a.

Figure 5G:
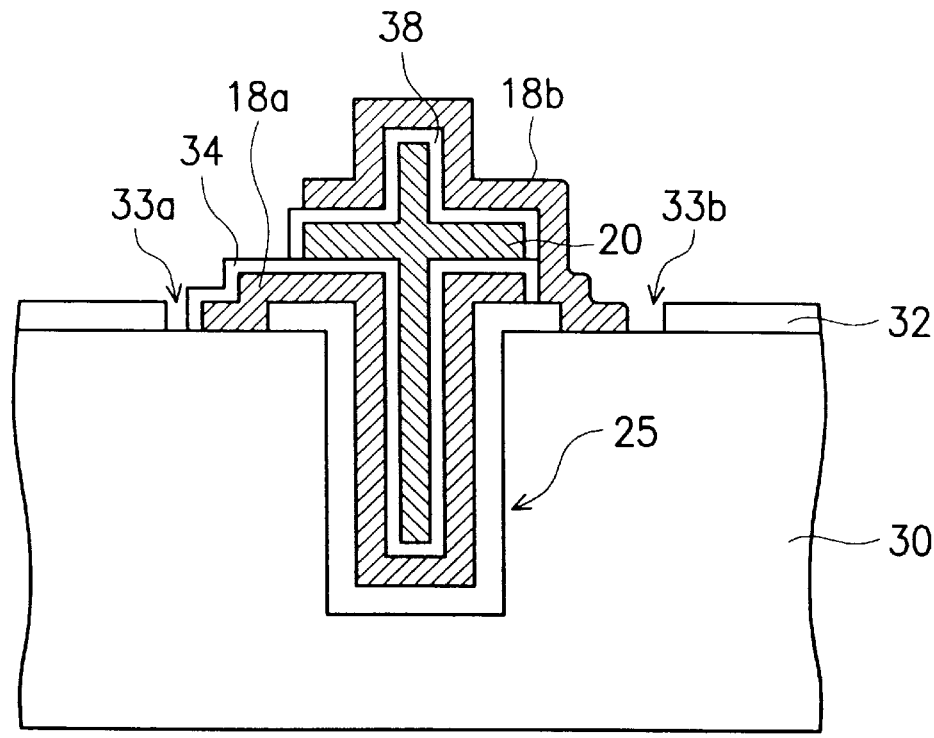

Referring next to FIG. 5G, another conducting layer, such as a polysilicon layer with a thickness between 500 to 2000 Å, is formed by the CVD method to cover all of the exposed surfaces including the silicon substrate surface inside the second opening 33b. Using photolithographic and etching techniques to define a pattern, a second storage electrode 18b is formed, with one end extending into the second opening 33b and making contact with silicon substrate 30. The second storage electrode 18b, the second dielectric layer 38 and an upper portion of the common opposed electrode 20 together form the structure of a second capacitor, i.e., a stacked type storage capacitor.

Figure 5H:
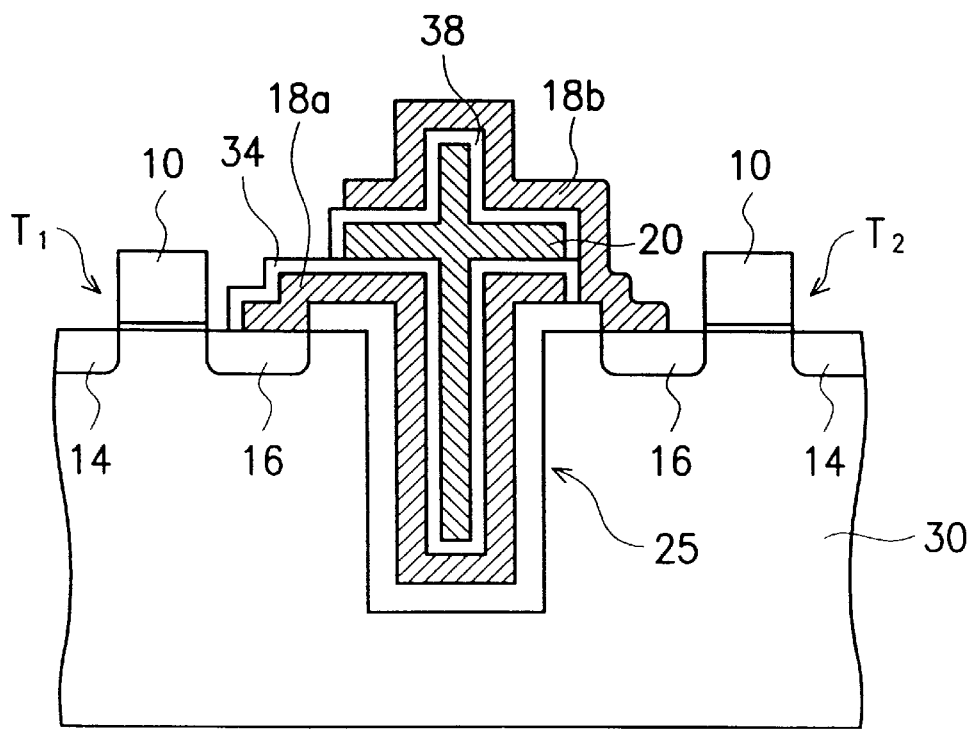

Lastly, referring to FIG. 5H, the exposed portion of the insulating layer 32 is etched away by immersion in an etchant such as buffered oxide etchant (B.O.E.). Then, using conventional processing procedures, gates 10, source regions 14 and drain regions 16 for pass transistors $T_1$ and $T_2$ are formed symmetrically in the silicon substrate 30 on opposite sides of the trench 25. Note that the two drain regions 16 of the pair of pass transistors $T_1$ and $T_2$ are facing each other internally, i.e., the drain regions 16 are disposed nearest the trench 25. Through this arrangement, the drain region 16 of pass transistor $T_1$ is electrically connected to the first storage electrode 18a, while the drain region 16 of the second pass transistor $T_2$ is electrically connected to the second storage electrode 18b, and thus a pair of memory cells having DRAM component structure according to the first exemplary embodiment of the invention is established.

SECOND EMBODIMENT

The second exemplary embodiment uses a different method to manufacture the same memory cell structure as described in the first embodiment. First, all the processes as described in FIGS. 5A to 5B are performed, that is, a trench 25 is etched out in a silicon substrate 30 followed by the sequential formation of an insulating layer 32, then a first storage electrode 18a, then a first dielectric layer 34 and finally a first opening 33a exposing a portion of the surface of the silicon substrate 30 adjacent to one side of the trench 25.

Figure 6A:
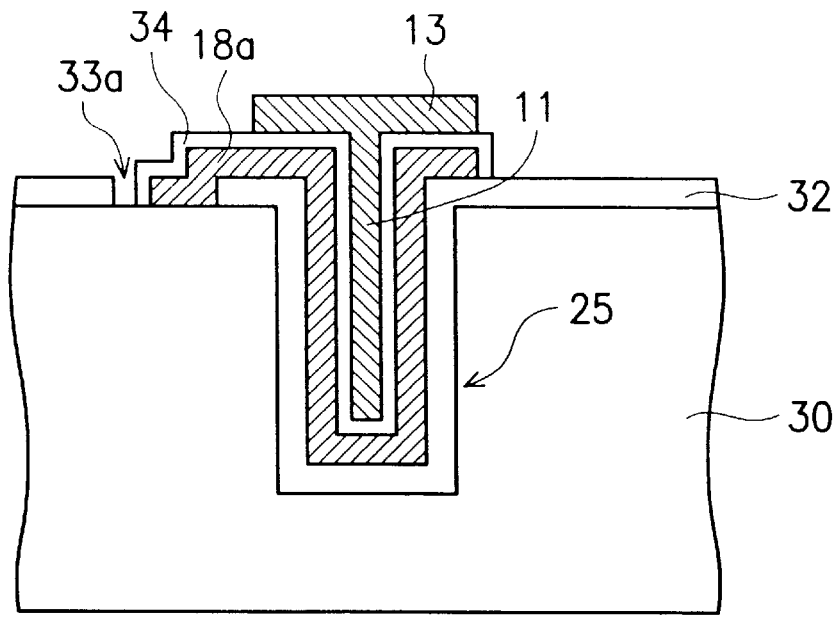
FIGS. 6A to 6B are cross-sectional views showing the manufacturing steps of a DRAM memory cell structure according to a second exemplary embodiment of the invention.

Referring next to FIG. 6A, a first conducting layer, such as a polysilicon layer with a thickness between 500 to 2000

Å, is formed filling up the trench 25 and covering the surface of the first dielectric layer 34 and the insulating layer 32. Then, using a layer of photoresist (not shown) as a mask, a pattern in the first conducting layer is defined. After processing by etching, the conducting material that remains inside the trench 25 forms a vertical main section 11 and that which lies above the first dielectric layer 34 forms a horizontal main plate 13.

Figure 6B:
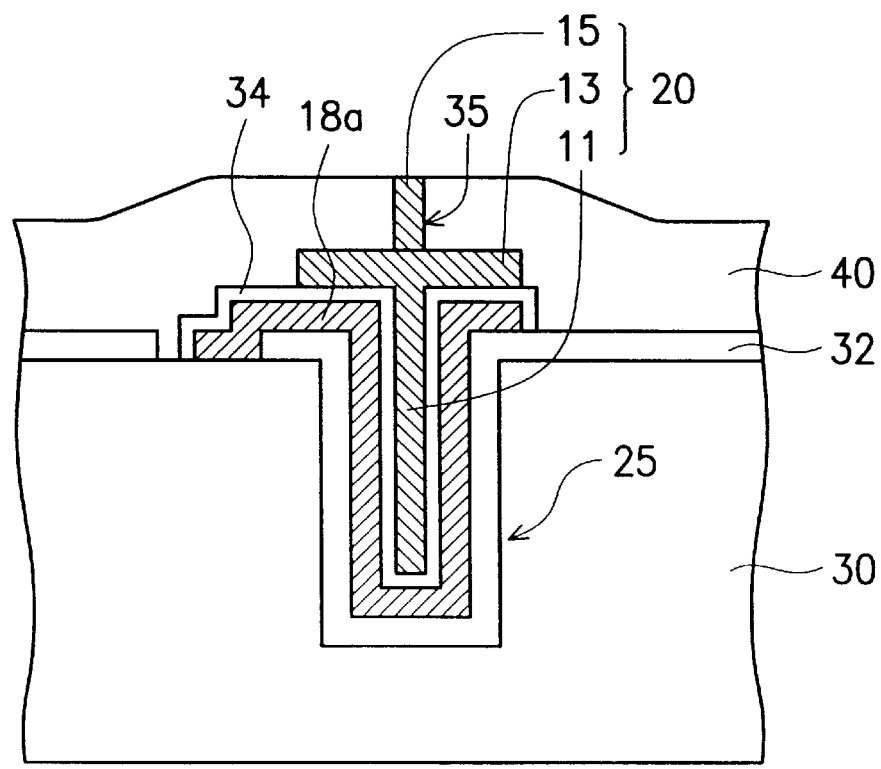

Referring next to FIG. 6B, a second insulating layer 40, such as an oxide layer, is formed by the CVD method covering the surface of the first conducting layer of the horizontal main plate 13, the first dielectric layer 34 and the insulating layer 32. Using photolithographic and etching techniques, an opening 35 is formed in the second insulating layer 40 exposing a portion of the surface of the main plate 13. Next, a second conducting layer is deposited filling up opening 35, then an etch back process is performed to form an extended section 15 protruding vertically upward. The extended section 15 can be a pillar shaped or a linear shaped structure, for example. The vertical main section 11 and the horizontal main plate 13 formed by the first conducting layer, and the extended section 15 formed by the second conducting layer, together constitute a common opposed electrode 20. After etching away the second insulating layer 40, a structure which is the same as in FIG. 5E is formed.

Thereafter, the processing steps as described for FIGS. 5E to 5H are performed, that is, a second dielectric layer 38 is formed, followed by the formation of a second storage electrode 18b, and then the pair of pass transistors are formed symmetrically around the capacitor, completing the establishment of a pair of memory cells having the DRAM component structure according to the second exemplary embodiment of the invention.

THIRD EMBODIMENT

The third exemplary embodiment is a variation of the first embodiment, and is used to increase the surface area of the common opposed electrode 20. First, all of the process steps as described with respect to FIGS. 5A to 5B are performed, that is, a trench 25 in a silicon substrate 30 is etched out followed by the sequential formation of an insulating layer 32, a first storage electrode 18a, a first dielectric layer 34, and finally a first opening 33a exposing a portion of the surface of the silicon substrate 30 adjacent to one side of the trench 25.

Figure 7A:
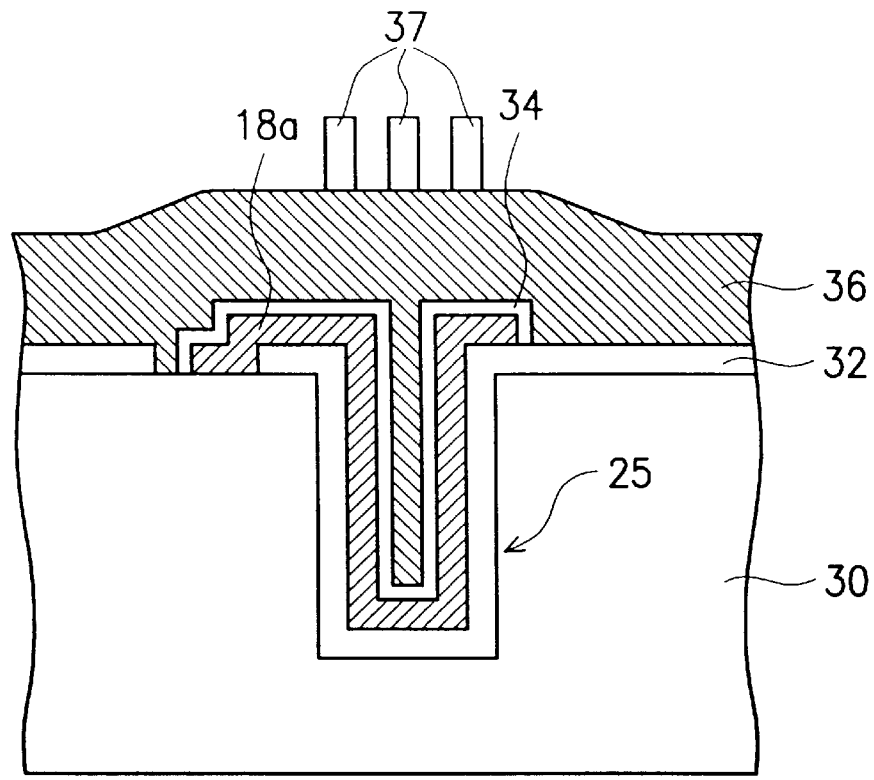
FIGS. 7A to 7F are a series of cross-sectional views showing the manufacturing steps of a DRAM memory cell structure according to a third exemplary embodiment of the invention.
Figure 7B:
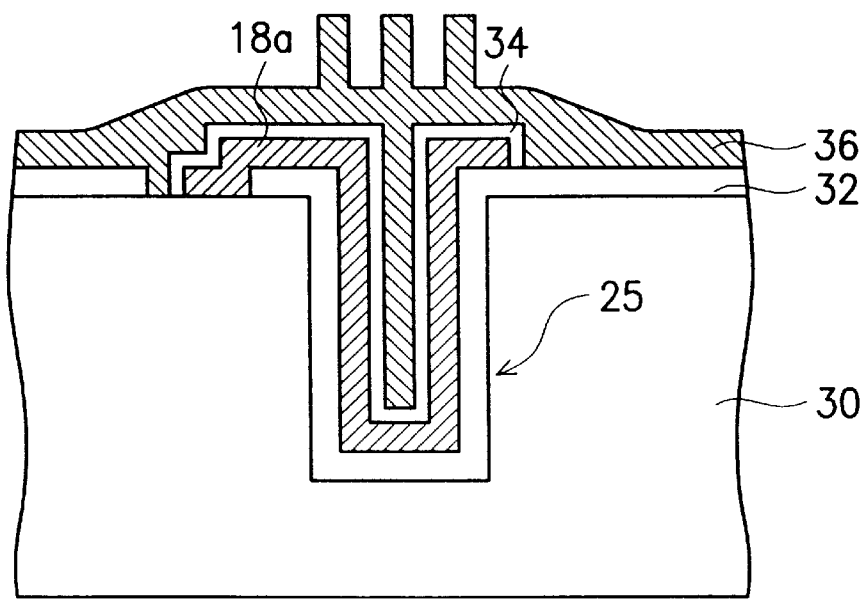

Referring now to FIG. 7A, a thick conducting layer 36, such as a polysilicon layer, is formed by the CVD method filling up the trench 25 and covering the surfaces of the first dielectric layer 34 and the insulating layer 32. Then, a layer of photoresist 37 is coated onto the surface of the thick conducting layer 36, and a photolithographic technique is used to define a pattern. With photoresist layer 37 as a mask, the top portion of the thick conducting layer 36 is etched away to form a number of extended sections, for example three sections, protruding as indicated in FIG. 7B. The extended sections can be pillar shaped, linear shaped or have a cross grid shape structure, for example.

Figure 7C:
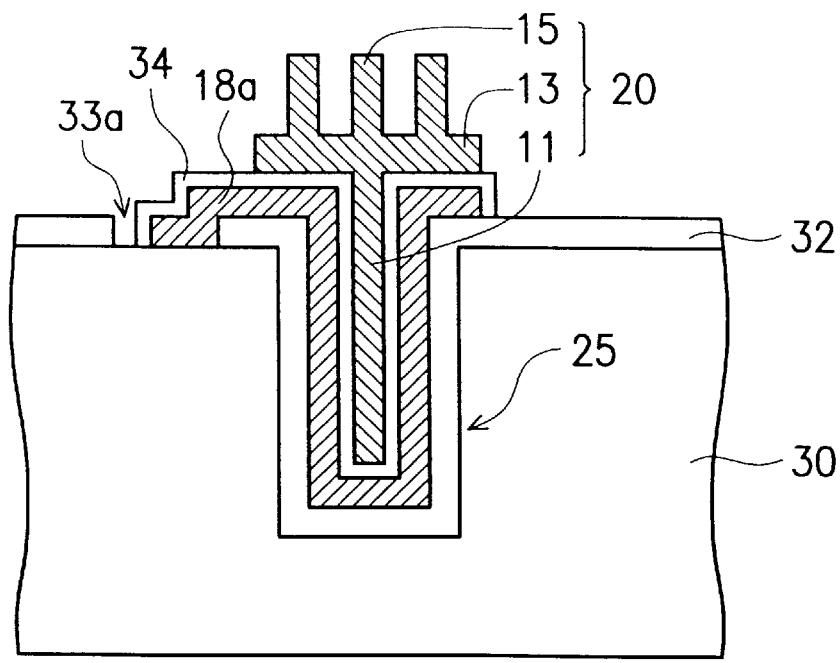

Next, using another layer of photoresist (not shown) as a mask covering the portion where the opposed electrode is to be located, the remaining thick conducting layer 36 is etched until the surface of the first dielectric layer 34 and the insulating layer 22 are exposed and the common opposed electrode structure 20 as defined in the thick conducting layer 36 is formed. The electrode structure 20 has a vertical main section 11 extending inside trench 25, a horizontal main plate 13, and a number of extended sections 15 protruding vertically upward, as shown in FIG. 7C. The first storage electrode 18a, the first dielectric layer 34 and a lower portion of the common opposed electrode 20 together form the structure of a first capacitor, i.e., a trench-type storage capacitor.

Figure 7D:
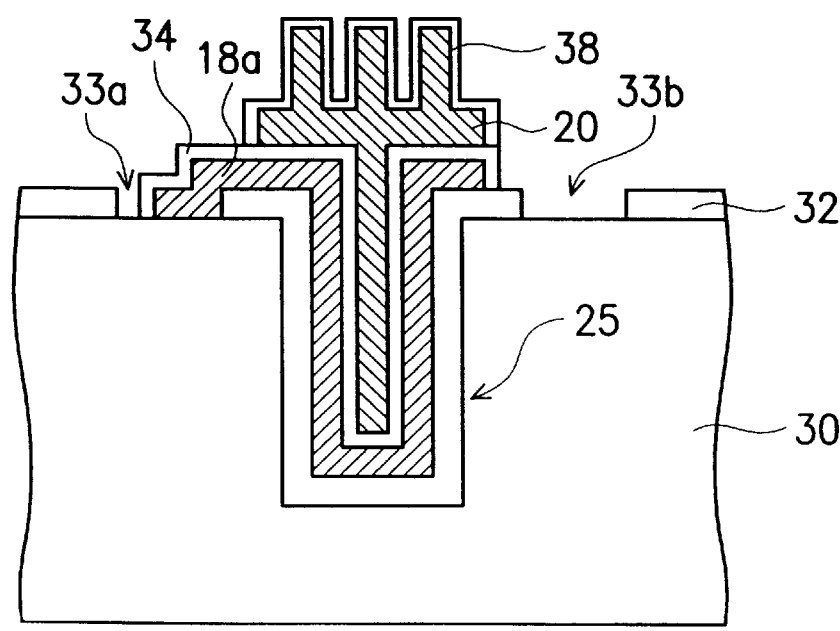

Referring next to FIG. 7D, a second dielectric layer 38, such as a nitride/oxide (NO) double layered structure or an oxide/nitride/oxide (ONO) triple layered structure, is formed covering the exposed upper surface of the common opposed electrode 20. Next, using photolithographic and etching techniques, a second opening 33b is formed in the insulating layer 32 exposing a portion of silicon substrate 30 surface adjacent to the trench 25 on the side opposite from the first opening 33a.

Figure 7E:
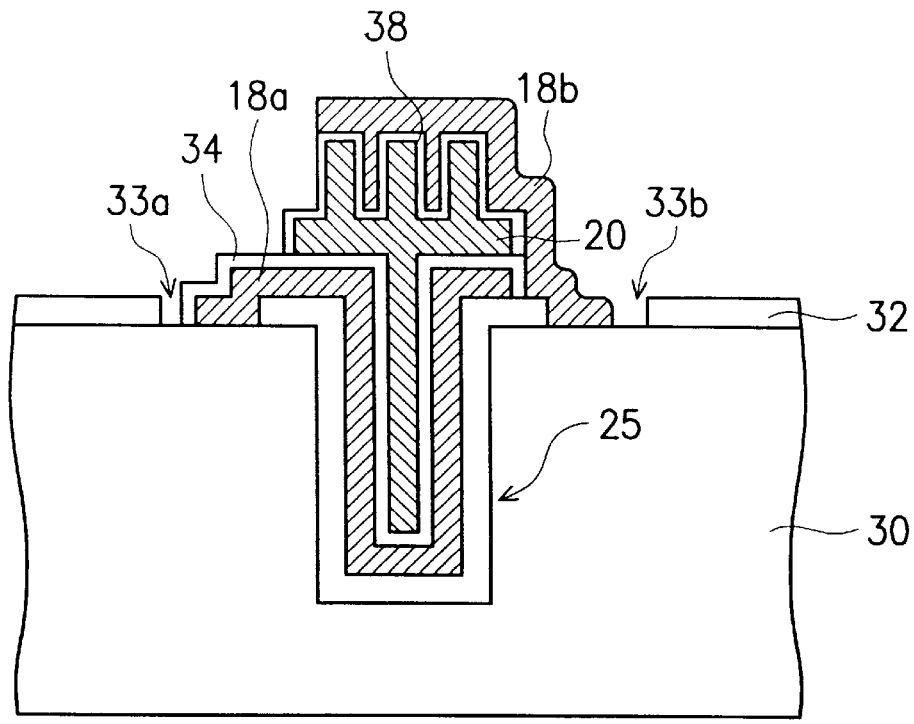

Referring next to FIG. 7E, another conducting layer, such as a polysilicon layer with a thickness between 500 to 2000 Å, is formed by the CVD method to cover all of the exposed surfaces including the silicon substrate surface inside the second opening 33b. Using photolithographic and etching techniques to define a pattern, a second storage electrode 18b is formed, with one end extending into the second opening 33b and making contact with silicon substrate 30. The second storage electrode 18b, the second dielectric layer 38 and an upper portion of the common opposed electrode 20 together form the structure of a second capacitor, i.e., a stack-type storage capacitor.

Figure 7F:
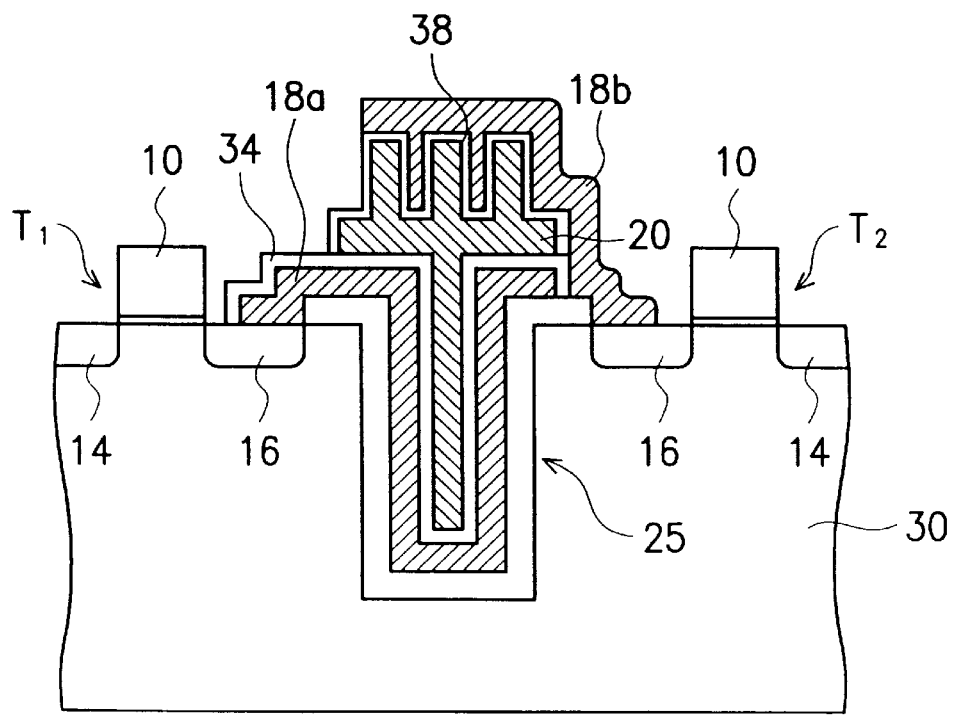

Lastly, referring to FIG. 7F, the exposed portion of the insulating layer 32 is etched away by immersion in an etchant such as buffered oxide etchant (B.O.E.). Then, using conventional processing procedures, gates 10, source regions 14 and drain regions 16 for pass transistors $T_1$ and $T_2$ are formed symmetrically in the silicon substrate 30 on opposite sides of the trench 25. Note that the two drain regions 16 of the pair of pass transistors $T_1$ and $T_2$ are facing each other internally, i.e., the drain regions 16 are disposed nearest the trench 25. Through this arrangement, the drain region 16 of pass transistor $T_1$ is electrically connected to the first storage electrode 18a, while the drain region 16 of the second pass transistor $T_2$ is electrically connected to the second storage electrode 18b, and thus a pair of memory cells having the DRAM component structure according to the third embodiment of the invention is established. Due to the addition of a number of extended sections 15 protruding vertically upward from the upper surface of the horizontal main plate 13 of the common opposed electrode 20, the effective surface area of the electrode 20 is increased and therefore the capacitance of the capacitor formed in this way is also increased.

FOURTH EMBODIMENT

The fourth embodiment uses a different method to manufacture the same memory cell structure as described in the third embodiment. First, all the processes as described in FIGS. 5A to 5B are performed, that is, a trench 25 is etched out in a silicon substrate 30 followed by the sequential formation of an insulating layer 32, a first storage electrode 18a, a first dielectric layer 34 and finally a first opening 33a exposing a portion of the surface of the silicon substrate 30 adjacent to one side of the trench 25.

Figure 8A:
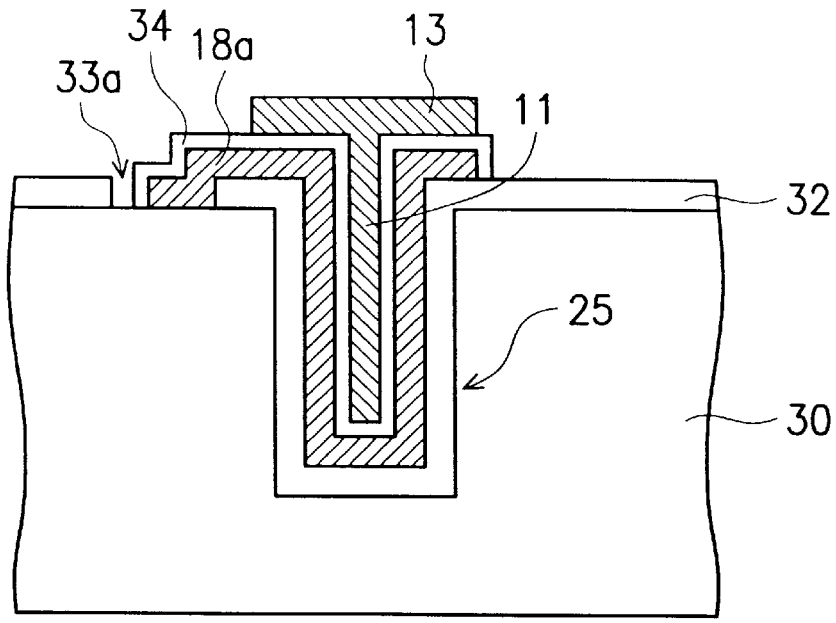
FIGS. 8A to 8B are a series of cross-sectional views showing the manufacturing steps of a DRAM memory cell structure according to a fourth exemplary embodiment of the invention.

Referring next to FIG. 8A, a first conducting layer, such as a polysilicon layer with a thickness between 500 to 2000 Å, is formed filling up the trench 25 and covering the surfaces of the first dielectric layer 34 and the insulating layer 32. Then, using a layer of photoresist (not shown) as a mask, a pattern in the first conducting layer is defined. After processing by etching, the conducting material that remains inside the trench 25 forms a vertical main section 11 and that which lies above the first dielectric layer 34 forms a horizontal main plate 13.

Figure 8B:
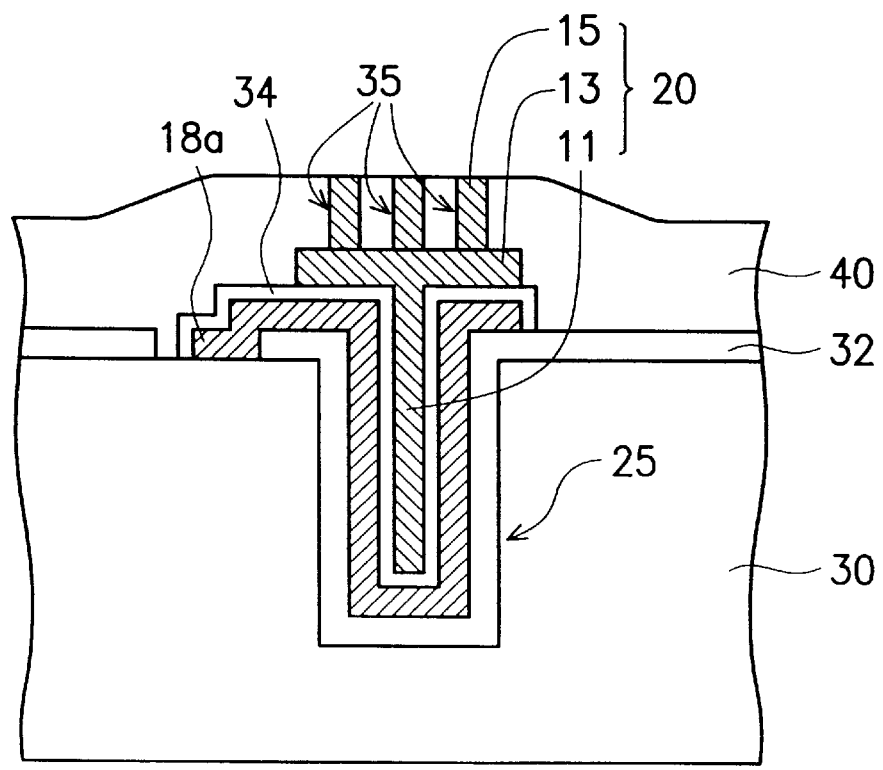

Referring next to FIG. 8B, a second insulating layer 40, such as an oxide layer, is formed by the CVD method covering the surfaces of the first conducting layer of the horizontal main plate 13, the first dielectric layer 34 and the insulating layer 32. Using photolithographic and etching techniques, an opening 35 is formed in the second insulating layer 40 exposing a portion of the surface of the main plate 13. Next, a second conducting layer is deposited filling up openings 35, then an etch back process is performed to form a number of extended sections 15 protruding vertically upward. The extended sections 15 can be pillar shaped, linear shaped or have a cross grid shaped structure, for example. The vertical main section 11 and the horizontal main plate 13 formed by the first conducting layer, and the extended sections 15 formed by the second conducting layer, together constitute a common opposed electrode 20. After etching away the second insulating layer 40, a structure which is the same as in FIG. 7C is formed.

Thereafter, the processing steps as described for FIGS. 7D to 7F are performed. That is, a second dielectric layer 38 is formed, followed by the formation of a second storage electrode 18b, and then the pair of pass transistors are formed symmetrically around the capacitor, completing the establishment of a pair of memory cells having the DRAM component structure according to the fourth exemplary embodiment of the invention.

FIFTH EMBODIMENT

For the fifth embodiment, first, all of the process steps as described with respect to FIGS. 5A to 5B are performed. That is, a trench 25 is etched out in a silicon substrate 30 followed by the sequential formation of an insulating layer 32, a first storage electrode 18a, a first dielectric layer 34, and finally a first opening 33a exposing a portion of the surface of the silicon substrate 30 adjacent to one side of the trench 25.

Figure 9A:
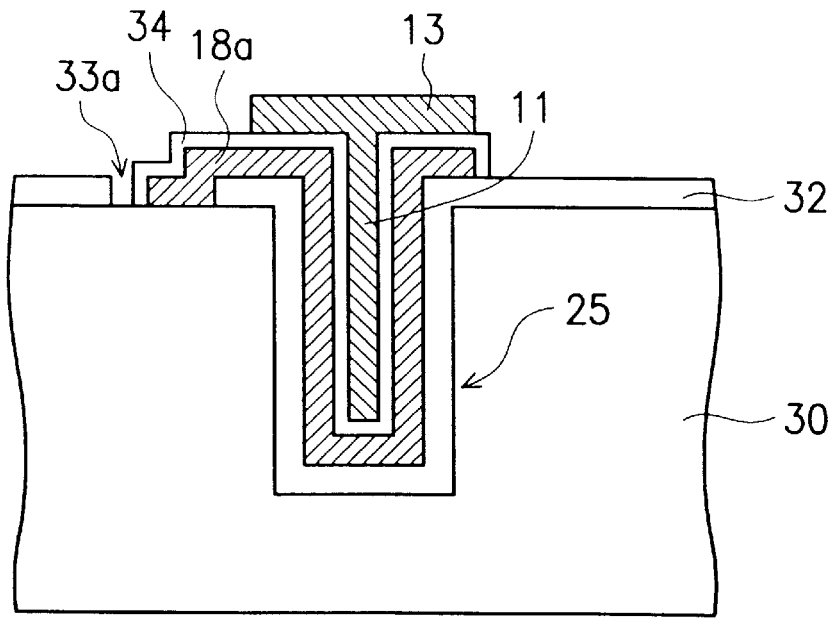
FIGS. 9A to 9E are a series of cross-sectional views showing the manufacturing steps of a DRAM memory cell structure according to a fifth exemplary embodiment of the invention.

Referring now to FIG. 9A, a first conducting layer, such as a polysilicon layer with a thickness between 500 to 2000 Å, is formed filling up the trench 25 and covering the surfaces of the first dielectric layer 34 and the insulating layer 32. Then, using a layer of photoresist (not shown) as a mask, a pattern in the first conducting layer is defined. After processing by etching, the conducting material that remains inside the trench 25 forms a vertical main section 11 and that which lies above the first dielectric layer 34 forms a horizontal main plate 13.

Figure 9B:
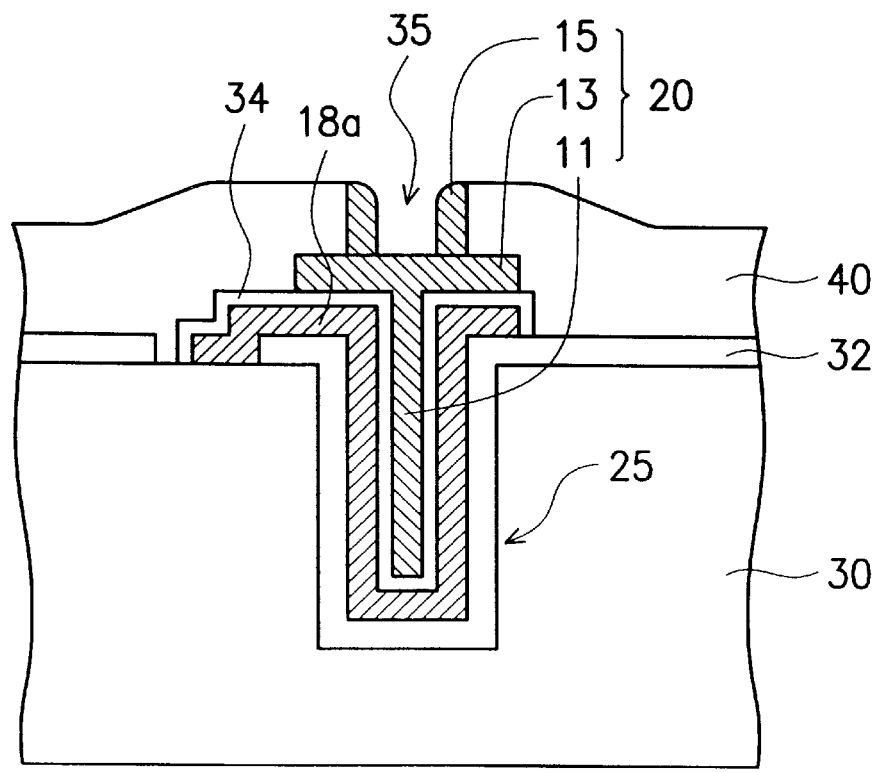

Referring next to FIG. 9B, a second insulating layer 40, such as an oxide layer, is formed by the CVD method covering the surfaces of the first conducting layer of the horizontal main plate 13, the first dielectric layer 34 and the insulating layer 32. Using photolithographic and etching techniques, an opening 35 is formed in the second insulating layer 40 exposing a portion of the surface of the main plate 13. Next, a second conducting layer covering the surface of the second insulating layer 40, as well as the side walls and bottom of opening 35 is deposited, and then an etch back process is performed so that a conducting side wall spacer layer surrounding the opening 35 is formed structured as an extended section 15 protruding up vertically with a hollow pipe profile. The vertical main section 11 and the horizontal main plate 13 formed by the first conducting layer, and the extended section 15 formed by the second conducting layer, together constitute a common opposed electrode 20.

Figure 9C:
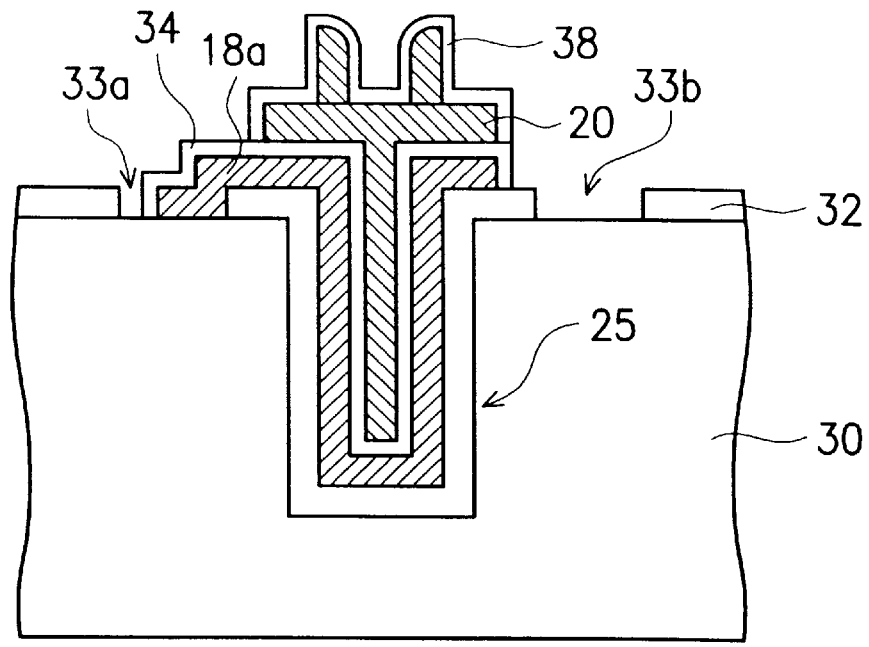

Referring next to FIG. 9C, the second insulating layer 40 is etched away. A second dielectric layer 38, such as a nitride/oxide (NO) double layered structure or an oxide/nitride/oxide (ONO) triple layered structure, is formed covering the exposed upper surface of the common opposed electrode 20. Next, using photolithographic and etching techniques, a second opening 33b is formed in the insulating layer 32 exposing a portion of the surface of the silicon substrate 30 adjacent to the trench 25 on the side opposite from the first opening 33a.

Figure 9D:
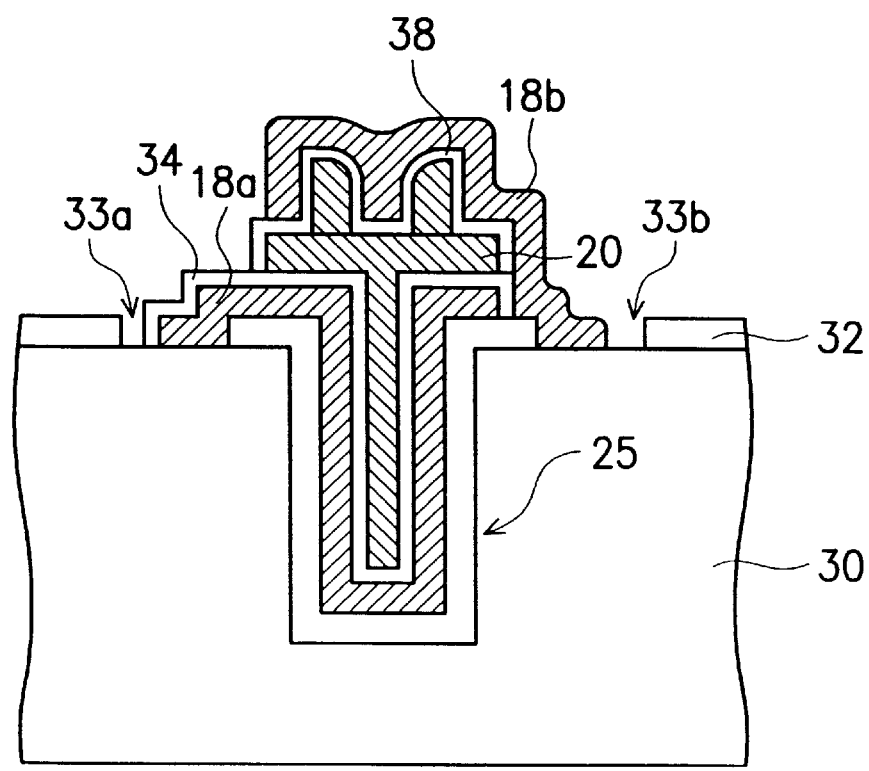

Referring next to FIG. 9D, another conducting layer, such as a polysilicon layer with a thickness between 500 to 2000 Å, is formed by the CVD method to cover all of the exposed surfaces including the silicon substrate surface inside the second opening 33b. Using photolithographic and etching techniques to define a pattern, a second storage electrode 18b is formed, with one end extending into the second opening 33b and making contact with silicon substrate 30. At this point, the first storage electrode 18a, the first dielectric layer 34 and a lower portion of the common opposed electrode 20 together form the structure of a first capacitor which is a trench-type storage capacitor, while the second storage electrode 18b, the second dielectric layer 38 and an upper portion of the common opposed electrode 20 together form the structure of a second capacitor which is a stack-type storage capacitor.

Figure 9E:
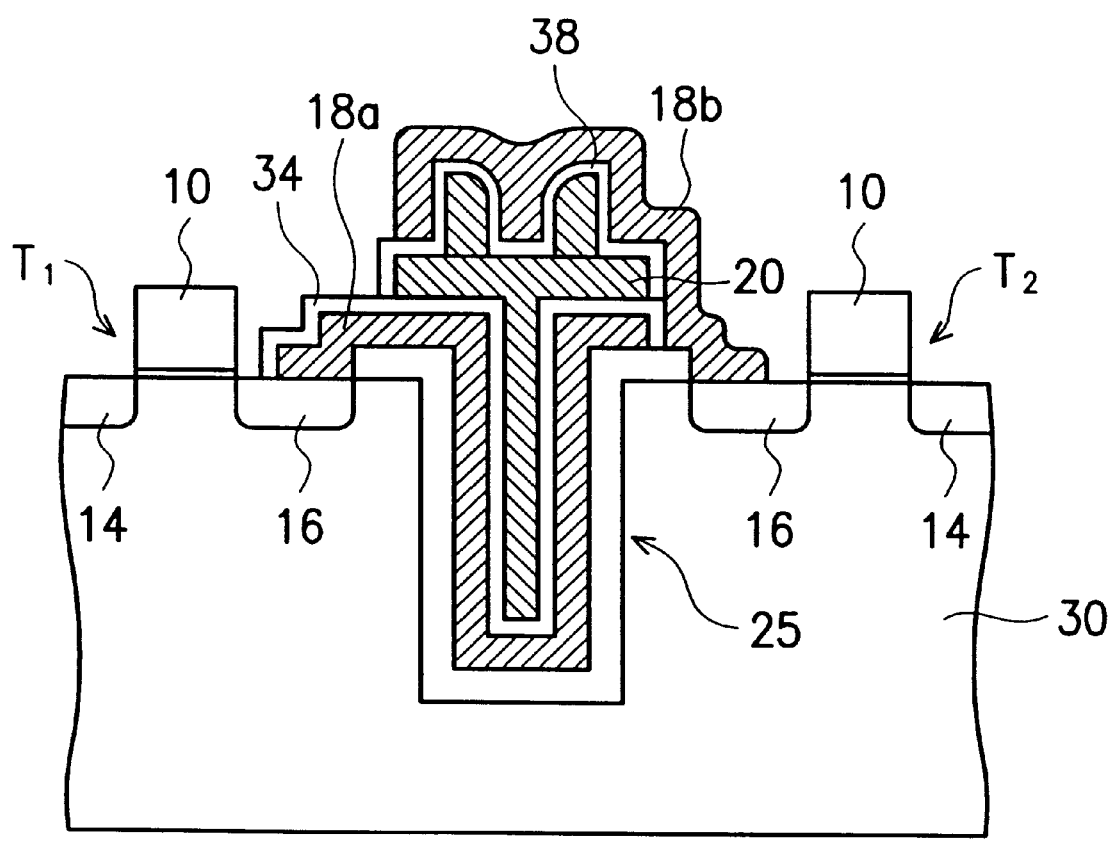

Lastly, referring to FIG. 9E, the exposed portion of the insulating layer 32 is etched away by immersion in an etchant such as buffered oxide etchant (B.O.E.). Then, using conventional processing procedures, gates 10, source regions 14 and drain regions 16 for pass transistors $T_1$ and $T_2$ are formed symmetrically in the silicon substrate 30 on opposite sides of the trench 25. Note that the two drain regions 16 of the pair of pass transistors $T_1$ and $T_2$ are facing each other internally, i.e., the drain regions 16 are disposed nearest the trench 25. Through this arrangement, the drain region 16 of pass transistor $T_1$ is electrically connected to the first storage electrode 18a, while the drain region 16 of the second pass transistor $T_2$ is electrically connected to the second storage electrode 18b, and thus a pair of memory cells having the DRAM component structure according to the fifth embodiment of the invention is established.

The characteristics of the above described exemplary preferred embodiments are subject to a number of variations within the scope of the invention. For instance, a number of side wall conducting spacer layers can be formed on the side walls of a number of openings resulting in a number of hollow pipe extensions; or side wall conducting spacer layers can be formed on the side walls of concentric openings, thereby resulting in a number of concentric hollow pipe extensions. Since these variations can be achieved simply by changing the photomasking pattern appropriately, or repeating the aforementioned processing steps, they are practical and easy to implement and, therefore, no further description is necessary.

While the invention has been described by way of example and in terms of a preferred embodiment, it is to be understood that the invention is not limited thereto. To the contrary, it is intended to cover various modifications and similar arrangements. Therefore, the scope of the appended claims should be accorded the broadest interpretation so as to encompass all such modifications and similar arrangements.

What is claimed is:

1. A method of manufacturing dual-packed capacitor DRAM cells, comprising:

(a) forming a trench having a bottom and side walls in a semiconductor substrate;

(b) forming an insulating layer covering the surface of the semiconductor substrate and the bottom and side walls of the trench;

(c) forming a first opening in the insulating layer exposing part of the semiconductor substrate adjacent to a first side of the trench;

(d) forming a first storage electrode inside the trench on the surface of the insulating layer, and which extends into the first opening and contacts the semiconductor substrate;

(e) forming a first dielectric layer covering the surface of the first storage electrode;

(f) forming a common opposed electrode above the first dielectric layer, the common opposed electrode including a vertical main section extending into the trench, a horizontal main plate extending parallel to the surface of the substrate, and at least one extended section extending from the horizontal main plate perpendicular to the semiconductor substrate surface, wherein the first storage electrode, the first dielectric layer and a lower portion of the common opposed electrode together constitute a first capacitor;

(g) forming a second dielectric layer above the common exposed electrode;

(h) forming a second opening in the insulating layer exposing part of the semiconductor substrate surface adjacent to a second side of the trench;

(i) forming a second storage electrode above the second dielectric layer, and which extends into the second opening and contacts the semiconductor substrate, wherein the second storage electrode, the second dielectric layer and an upper portion of the common opposed electrode together constitute a second capacitor;

(j) removing an exposed part of the insulating layer; and (k) forming a pair of pass transistors symmetrically on opposite sides of the trench in the semiconductor substrate, each pass transistor including a gate, a source and a drain region, the respective drain regions of the pass transistors being disposed nearest the trench, and each being electrically coupled with a respective storage electrode.

2. A method according to claim 1, wherein said step (f) comprises:

depositing a thick conducting layer filling up the trench and covering the surface of the first dielectric layer and the insulating layer;

using a layer of a photoresist mask, forming the at least one extended section protruding vertically upward perpendicular to the surface of the semiconductor surface by etching away a portion of the top thick conducting layer; and using another photoresist layer as a mask, etching away the remaining portion of the thick conducting layer until the surface of the first dielectric layer and the insulating layer are exposed to define a boundary pattern of the thick conducting layer, thereby forming the common opposed electrode.

3. A method according to claim 2, wherein the at least one extended section protruding vertically upward comprises a conducting layer with a pillar shaped structure.

4. A method according to claim 2, wherein the at least one extended section protruding vertically upward comprises a conducting layer with a linear shaped structure.

5. A method according to claim 2, wherein the at least one extended section protruding vertically upward comprises a conducting layer with a cross grid shaped structure.

6. A method according to claim 1, wherein said step (f) comprises:

depositing a first conducting layer filling up the trench and covering the surface of the first dielectric layer and the insulating layer;

using a layer of photoresist as a mask defining a pattern on the first conducting layer such that what remains inside the trench constitutes a vertical main section and what lies above the first dielectric layer constitutes a horizontal main plate;

depositing a second insulating layer above the first conducting layer, the first dielectric layer and the insulating layer;

forming at least one opening in the second insulating layer and exposing part of the first conducting layer surface;

depositing a second conducting layer filling up the at least one opening, thereby forming the least one extended section protruding vertically upward perpendicular to the semiconductor surface; and removing the second insulating layer, leaving behind the first conducting layer and the second conducting layer, which together form the common opposed electrode.

7. A method according to claim 6, wherein the at least one extended section protruding vertically upward comprises a conducting layer with a pillar shaped structure.

8. A method according to claim 6, wherein the at least one extended section protruding vertically upward comprises a conducting layer with a linear shaped structure.

9. A method according to claim 6, wherein the at least one extended section protruding vertically upward comprises a conducting layer with a cross grid shaped structure.

10. A method according to claim 6, wherein the second insulating layer comprises a silicon dioxide layer.

11. A method according to claim 1, wherein said step (f) comprises:

depositing a first conducting layer filling up the trench and covering the surface of the first dielectric layer and the insulating layer;

using a layer of photoresist as a mask, defining a pattern on the conducting layer such that what remains inside the trench constitutes a vertical main section and what lies above the first dielectric layer constitutes a horizontal main plate;

depositing a second insulating layer above the first conducting layer, the first dielectric layer and the insulating layer;

forming an opening in the second insulating layer exposing part of the first conducting layer surface;

depositing a second conducting layer and performing an etch back process to form a conducting side wall spacer layer in the opening with the second conducting layer forming the at least one extended section protruding vertically upward as a hollow pipe shaped structure; and removing the second insulating layer, leaving behind the first conducting layer and the conducting side wall spacer layer which together form the common opposed electrode.

12. A method according to claim 1, wherein the trench has a depth in the range of approximately 4 to 10 µm.

13. A method according to claim 1, wherein the insulating layer comprises a silicon dioxide layer.

14. A method according to claim 1, wherein the first storage electrode, the common opposed electrode and the second storage electrode comprise layers made from polysilicon material.

15. A method according to claim 1, wherein the first and second dielectric layers comprise nitride/oxide double layers.

16. A method according to claim 1, wherein the first and second dielectric layers comprise oxide/nitride/oxide triple layers.

* * * * *